United States Patent
Kim et al.

(10) Patent No.: US 8,115,559 B2
(45) Date of Patent: Feb. 14, 2012

(54) OSCILLATOR FOR PROVIDING A CONSTANT OSCILLATION SIGNAL, AND A SIGNAL PROCESSING DEVICE INCLUDING THE OSCILLATOR

(75) Inventors: Hyoung Rae Kim, Hwasung-si (KR); Nam Jin Song, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 58 days.

(21) Appl. No.: 12/652,296

(22) Filed: Jan. 5, 2010

(65) Prior Publication Data

US 2010/0171558 A1 Jul. 8, 2010

(30) Foreign Application Priority Data

Jan. 6, 2009 (KR) .................. 10-2009-0000726

(51) Int. Cl.
*H03K 3/03* (2006.01)
*H03L 1/00* (2006.01)
*H03L 7/099* (2006.01)

(52) U.S. Cl. ............. 331/57; 331/176; 331/185; 331/17

(58) Field of Classification Search .................... 331/57, 331/176, 175, 66, 185, 74, 17
See application file for complete search history.

(56) References Cited

U.S. PATENT DOCUMENTS

| | | | |
|---|---|---|---|
| 6,252,467 B1 | 6/2001 | Yoshimura | |
| 7,190,234 B2 * | 3/2007 | Isobe | 331/57 |
| 7,205,855 B2 * | 4/2007 | Maruyama et al. | 331/74 |
| 7,391,274 B2 * | 6/2008 | Hsu | 331/57 |
| 7,586,380 B1 * | 9/2009 | Natarajan et al. | 331/57 |
| 2009/0072914 A1 * | 3/2009 | Murata | 331/57 |

FOREIGN PATENT DOCUMENTS

| | | |
|---|---|---|
| JP | 2000-244285 | 9/2000 |
| JP | 2004-304564 | 10/2004 |
| KR | 1020040078417 | 9/2004 |

OTHER PUBLICATIONS

Sundaresan, et al.; "Process and temperature compensation in a 7-MHz CMOS clock oscillator"; Solid-State Circuits, IEEE Journal of; vol. 41, Issue: 2; Feb. 2006, pp. 433-442.*

* cited by examiner

*Primary Examiner* — Ryan Johnson
(74) *Attorney, Agent, or Firm* — F. Chau & Associates, LLC

(57) ABSTRACT

An oscillator including a current bias circuit and a ring oscillator. The current bias circuit tracks a temperature change of the oscillator by using a control voltage and generates a plurality of bias voltages to supply a bias current according to the temperature change. The ring oscillator compares differential output signals generated according to the bias voltages and generates an oscillation signal as a result of the comparison.

14 Claims, 12 Drawing Sheets

OSCILLATOR FOR PROVIDING A CONSTANT OSCILLATION SIGNAL, AND A SIGNAL PROCESSING DEVICE INCLUDING THE OSCILLATOR

CROSS-REFERENCE TO RELATED APPLICATION

This application claims priority under 35 U.S.C. §119 to Korean Patent Application No. 10-2009-0000726, filed on Jan. 6, 2009, in the Korean Intellectual Property Office, the disclosure of which is incorporated by reference herein in its entirety.

BACKGROUND

1. Technical Field

The present inventive concept relates to a semiconductor device, and more particularly, to an oscillator for providing a constant oscillation signal when a power voltage or temperature is changed, and a signal processing device including the same.

2. Discussion of Related Art

High quality, multifunction, and high speed semiconductor devices use a variety of operating frequencies to drive internal circuits. In particular, an oscillator that can operate at a speed of over 10 MHz is needed for a semiconductor device to perform a high speed operation such as operation processing. A relaxation-oscillator has been used to generate a low operating frequency, for example, a signal in a 1 MHz band. To use a relaxation-oscillator at a high speed, an internal RC value may be made small. However, this may increase the oscillator's power consumption and cause an unstable oscillation frequency due to a change in a power voltage or a change in temperature. As a result, there is a need for an oscillator that can generate a constant oscillation frequency independent of external conditions such as temperature and power voltage.

SUMMARY

The inventive concept provides an oscillator which may generate bias voltages by tracking a temperature change of the oscillator and may generate a constant oscillation signal unaffected by the temperature change by controlling bias current in an internal circuit according to the bias voltages, and a signal processing device including the oscillator.

According to an exemplary embodiment of the inventive concept, there is provided an oscillator including a current bias circuit tracking a temperature change of the oscillator by using a control voltage and generating a plurality of bias voltages to supply a bias current according to the temperature change, and a ring oscillator comparing differential output signals generated according to the bias voltages and generating an oscillation signal as a result of the comparison.

The current bias circuit may include a first voltage-current conversion circuit converting the control voltage to a reference current, a current-voltage conversion circuit sensing the temperature change of the oscillator and converting the reference current to a sensing voltage according to a result of the sensing, and a second voltage-current conversion circuit converting the sensing voltage to the bias current.

The oscillator may include a bias circuit enabling operation of the first and second voltage-current conversion circuits in response to an enable signal.

The first voltage-current conversion circuit may include a first comparator comparing the control voltage and a voltage of a feedback node and generating a first comparison voltage, a switch supplying a power voltage to the feedback node in response to the first comparison voltage, and a reference current generation circuit generating the reference current based on a voltage of the feedback node. The reference current may be determined based on the control voltage and a resistance value of the reference current generation circuit.

The current-voltage conversion circuit may copy the reference current and convert the copied reference current to the sensing voltage. The current-voltage conversion circuit may include a voltage-current converter generating an intermediate current controlled according to the first comparison voltage, and a current-voltage converter converting the intermediate current to the sensing voltage. The current-voltage converter may be a diode-connected MOSFET that has a temperature coefficient reversely proportional to temperature.

The second voltage-current circuit may include a second comparator comparing the sensing voltage and a voltage of an output terminal of the current bias circuit and outputting a second comparison voltage, and a voltage-current converter supplying the bias current controlled according to the second comparison voltage to the output terminal of the current bias circuit.

The voltage-current converter may include a symmetric load that causes the bias current having a proportional to absolute temperature characteristic to be offset by the sensing voltage having a complementary to absolute temperature characteristic.

The symmetric load may include a transistor controlled in response to the sensing voltage and a diode-connected transistor controlled in response the second comparison voltage.

The oscillator may include a band gap reference circuit generating the control voltage.

The current bias circuit may track a change in a power voltage applied to the oscillator and generate another plurality of bias voltages to supply another bias current according to the power voltage change, and the ring oscillator may compare differential output signals generated according to the another bias voltages and generate another oscillation signal as a result of the comparison.

According to an exemplary embodiment of the inventive concept, an oscillator includes: a current bias circuit tracking a change in a power voltage applied to the oscillator and generating a plurality of bias voltages to supply a bias current according to the power voltage change; and a ring oscillator including an oscillator unit and a comparator, wherein the oscillator and comparator are driven by the bias current to produce an oscillation signal.

According to an exemplary embodiment of the inventive concept, there is provided a signal processing device including an oscillator providing a drive signal, wherein the oscillator includes a current bias circuit tracking a temperature change of the oscillator by using a control voltage and generating a plurality of bias voltages to supply a bias current according to the temperature change, and a ring oscillator comparing differential output signals generated according to the bias voltages and generating the drive signal as a result of the comparison.

The signal processing device may include a processor controlling a data input/output operation in response to the drive signal.

The signal processing device may include a timing controller dividing the drive signal and generating a control signal, and a source driver controlling a data input/output operation in response to the control signal.

The current bias circuit may track a change in a power voltage applied to the oscillator and generate another plurality of bias voltages to supply another bias current according to the power voltage change, and the ring oscillator compares differential output signals generated according to the another bias voltages and generates another drive signal as a result of the comparison.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Figure 1:
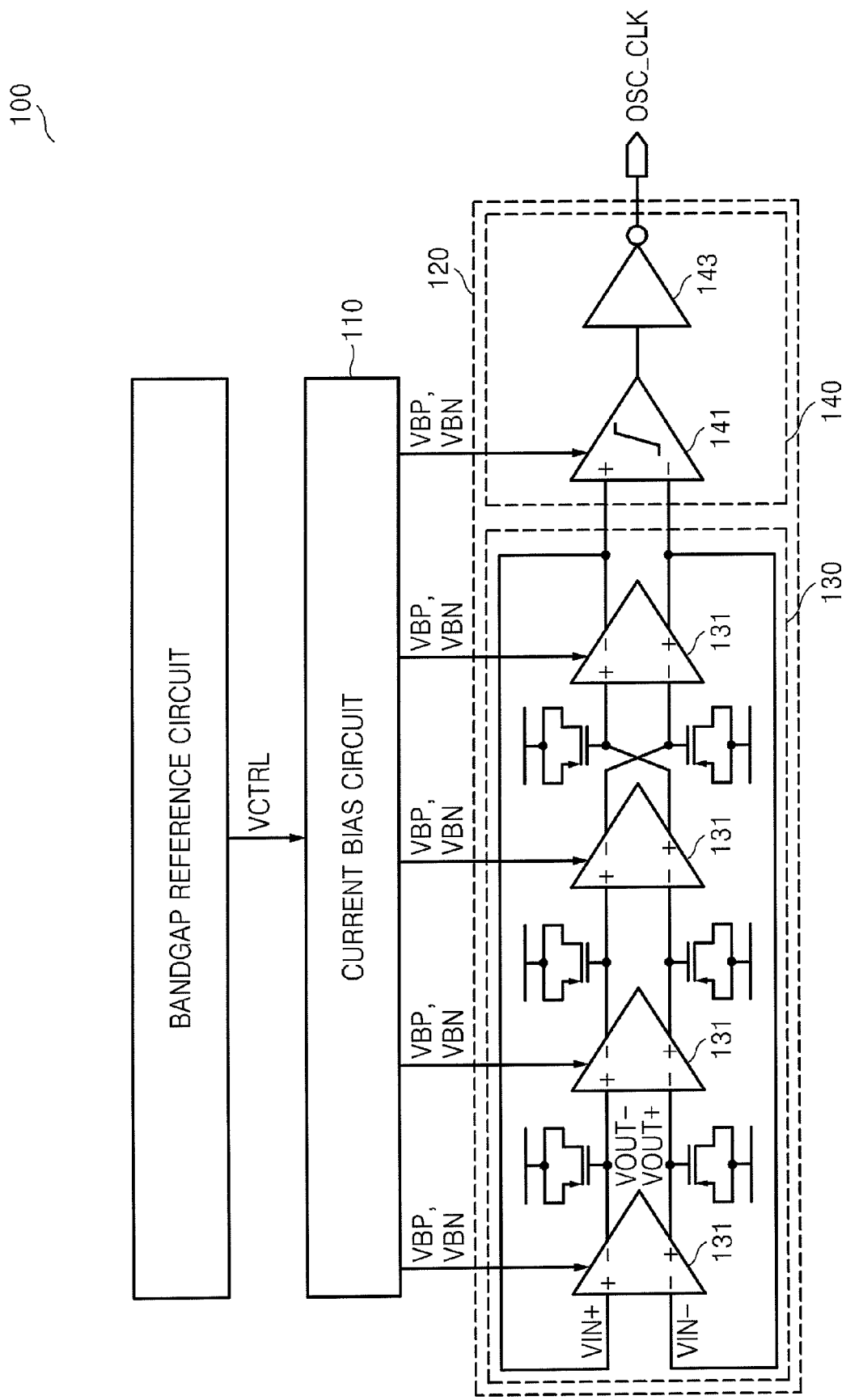
FIG. 1 is a block diagram of art oscillator according to an exemplary embodiment of the present inventive concept.

Hereinafter, exemplary embodiments of the inventive concept will be described more fully with reference to the accompanying drawings. The inventive concept may, however, be embodied in many different forms and should not be construed as limited to the embodiments set forth herein. Like reference numerals in the drawings may denote like elements.

Figure 2:
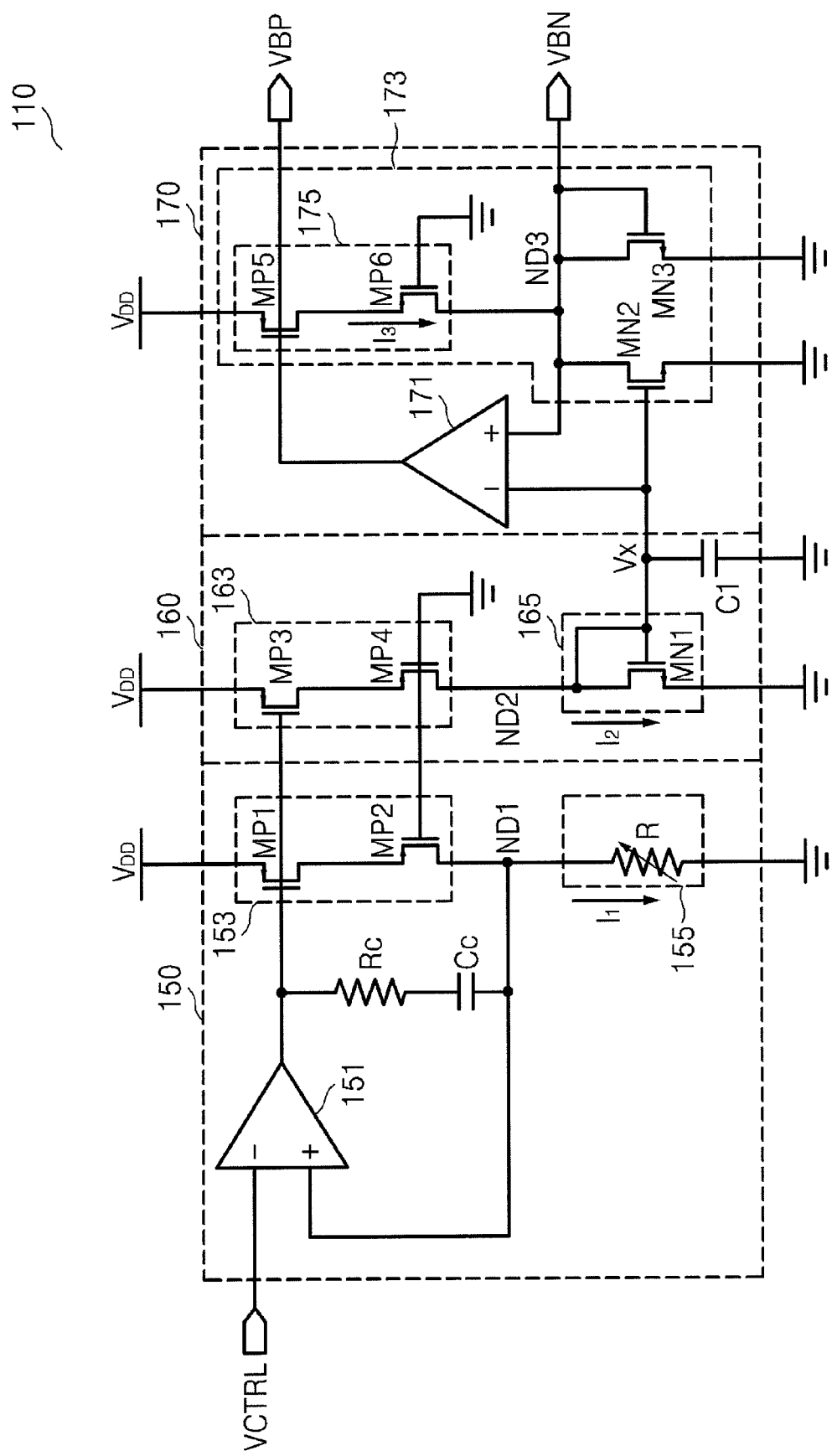
FIG. 2 is a circuit diagram of a current bias circuit according to an exemplary embodiment of the present inventive concept.

FIG. 1 is a block diagram of an oscillator 100 according to an exemplary embodiment of the present inventive concept. Referring to FIGS. 1 and 2, the oscillator 100 may include a current bias circuit 110 and a ring oscillator 120. The current bias circuit 110 may track a temperature change based on a control voltage VCTRL output from a band gap reference circuit and generate a bias current I3 that remains constant in light of the temperature change.

The band gap reference circuit supplies a reference voltage or a reference current of a constant level that is not affected by changes in power voltage, temperature, and process, due to an output characteristic in which a negative (−) temperature coefficient and a positive (+) temperature coefficient are offset by each other, and may generate a constant control voltage VCTRL according to the supply of power.

In other words, the current bias circuit 110 may generate bias voltages VBP and VBN by using the control voltage VCTRL output from the band gap reference circuit and supply the bias current I3 to the ring oscillator 120 according to the generated bias voltages VBP and VBN. In addition, the current bias circuit 110 may control the bias current I3 such that the maximum swing range is set according to the control voltage VCTRL and generate the bias current I3 that is stable, regardless of a change in the supply of power.

The ring oscillator 120 includes an oscillation unit 130 and a clock signal generator 140, generates the bias current I3 according to the bias voltages VBP and VBN supplied by the current bias circuit 110, and compares differential input signals VIN+ and VIN− according to the generated the bias current I3 to generate an oscillation signal as a result of the comparison.

The oscillation unit 130 includes a plurality of differential inverters 131. In the differential inverters 131, a first output terminal (+) and a second output terminal (−) of any one of the differential inverters 131 are connected to a first input terminal (−) and a second input terminal (+) of another one of the differential inverters 131 with opposite phases. The oscillation unit 130 may sequentially generate differential output signals VOUT+ and VOUT− having a constant phase difference at each of the differential inverters 131. For convenience of explanation, in the present exemplary embodiment, the oscillation unit 130 is implemented as a 4-step differential ring oscillator 120. However, the present inventive concept is not limited thereto.

Each differential inverter 131, except for the differential inverter 131 connected to the clock signal generator 140 has a transistor connected to each of its output terminals. When each of these transistors has the same size as each input transistor of a comparator 141 of the clock signal generator 140, a frequency characteristic is improved so that an influence due to delay by a capacitor may become stable.

The clock signal generator 140 includes the comparator 141 and an inverter 143. The comparator 141 receives differential output signals output from the oscillation unit 130 and compares the received output signals to each other to output a comparison signal according to a result of the comparison. Since the differential output signals of the oscillation unit 130 are also applied as the differential input signals VIN+ and VIN− of the oscillation unit 130, the comparator 141 may generate a comparison signal that is repeated with a constant period of a first logic level, for example, a low level, and a second logic level, for example, a high level.

The comparator 141 is used to convert differential output signals to a single-ended signal and may be implemented in a variety of methods to increase gain of the comparator 141. The inverter 143 may output an oscillation signal OSC_CLK according to a comparison signal output from the comparator 141.

The constant bias current I3 to drive an internal circuit of the ring oscillator 120, in other words, the oscillation unit 130 and the comparator 141, is supplied to allow the oscillation signal OSC_CLK output from the ring oscillator 120 to have a constant period. The amount of the bias current I3 of the ring oscillator 120 is controlled by the bias voltages VBP and VBN supplied by the current bias circuit 110.

Since the control voltage VCTRL output from the band gap reference circuit is not affected by a temperature change, the oscillator 100 that is ideal may generate the oscillation signal OSC_CLK having a constant period according to the control voltage VCTRL.

However, when the oscillator 100 is controlled by using just a control voltage that is not affected by a temperature change, the amount of current flowing in the internal circuit may substantially vary according to the temperature change of the oscillator 100. In other words, the amount of the bias current I3 flowing in the oscillator 100 changes with a temperature-proportional characteristic according to the temperature change so that the output signal of the oscillator 100 may have the temperature-proportional characteristic. Thus, the frequency of the output signal of the oscillator 100 varies according to the temperature change.

However, according to the present exemplary embodiment, since the oscillator 100 generates the bias voltages VBP and VBN by sensing in real time the changes in the power voltage of the internal circuit and the temperature, the amount of the bias current I3 flowing in the ring oscillator 120 is controlled to be constant according to the generated bias voltages VBP and VBN so that the oscillation signal OSC_CLK may be stably supplied.

FIG. 2 is a circuit diagram of a current bias circuit according to an exemplary embodiment of the present inventive concept. Referring to FIG. 2, the current bias circuit 110 may include a first voltage-current conversion circuit 150, a current-voltage conversion circuit 160, and a second voltage-current conversion circuit 170.

The first voltage-current conversion circuit 150 may include a first comparator 151, a switch 153, and a reference current generation circuit 155. The first comparator 151 may receive the control voltage VCTRL input to a first input terminal (−) and a voltage of a feedback node ND1 input to a second input terminal (+), and compare the received control voltage VCTRL and the voltage of the feedback node ND1 to generate a first comparison voltage. The switch 153 connects between the feedback node ND1 and a first node to which a power voltage VDD is supplied, and may form a current path between the first node and the feedback node ND1 by being switched in response to the first comparison voltage output from the first comparator 151.

The switch 153 may be implemented by a PMOS transistor or an NMOS transistor. For example, when the switch 153 is implemented by a PMOS transistor, the switch 153 may perform a switching on operation in response to the first comparison voltage having a first logic level, for example, a low level. When the switch 153 is implemented by an NMOS transistor, the switch 153 may perform a switching on operation in response to the first comparison voltage having a second logic level, for example, a high level.

In addition, the switch 153 may further include a transistor MP2 operating in a linear region. When the transistor MP2 is implemented by a PMOS transistor, a gate of the PMOS transistor is connected to a second node to which a ground voltage is applied. However, when the transistor MP2 operating in the linear region is implemented by an NMOS transistor, a gate of the NMOS transistor is connected to the first node to which the power voltage $V_{DD}$ is applied. In this case, the transistor MP2 may always maintain a turn-on state.

The reference current generation circuit 155 is connected between the feedback node ND1 and the second node to which the ground voltage is applied. The reference current generation circuit 155 may generate a reference current I1 that is not affected by a temperature change based on the voltage of the feedback node ND1. The reference current generation circuit 155 may be implemented by a resistor R. The amount of the reference current I1 may be determined according to the control voltage VCTRL and the resistance value of the reference current generation circuit 155.

In addition, in the first voltage-current conversion circuit 150, since the voltage of the feedback node ND1 is fed back to the second input terminal (+) of the first comparator 151, the change in the reference current I1 may be reflected. Thus, since the amount of current flowing from the first node to the feedback node ND1 may be controlled according to the output of the first comparator 151, even when the power voltage $V_{DD}$ changes, the reference current I1 that is constant may be generated by sensing the change in the power voltage $V_{DD}$. In addition, the first voltage-current conversion circuit 150 may further include a compensation resistor Rc and a compensation capacitor Cc that are serially connected between the output terminal of the first comparator 151 and the feedback node ND1.

The current-voltage conversion circuit 160 includes a voltage-current converter 163 and a current-voltage converter 165, and may copy the reference current I1 flowing in the feedback node ND1 and convert the copied reference current I1 to a sensing voltage Vx. The voltage-current converter 163 is connected between a sensing node ND2 and the first node to which the power voltage $V_{DD}$ is supplied, and may form a current path between the first node and the sensing node ND2 in response to the first comparison voltage output from the first comparator 151. The voltage-current converter 163 may be implemented by a PMOS transistor or an NMOS transistor, and generates an intermediate current I2.

When the size of the PMOS transistor MP1 of the first voltage-current conversion circuit 150, for example, a ratio between width and length, and the size of PMOS transistor MP3 of the voltage-current conversion circuit 163 are the same, the current flowing in the transistor MP3 is the same as the current flowing in the transistor MP1. In addition, the voltage-current converter 163 may further include a transistor MP4 operating in the linear region. When the transistor MP4 is implemented by a PMOS transistor, a gate of the PMOS transistor is connected to a node to which the ground voltage is supplied. However, when the transistor MP4 operating in the linear region is implemented by an NMOS transistor, a gate of the NMOS transistor is connected to the first node to which the power voltage $V_{DD}$ is supplied. In this case, the transistor MP4 may always maintain a turn-on state.

The current-voltage converter 165 is connected between the sensing node ND2 and the second node to which the ground voltage is supplied. The current-voltage converter 165 may convert the intermediate current I2 flowing in the sensing node ND2 to the sensing voltage Vx by tracking the temperature change of the oscillator 100.

The current-voltage converter 165 may be implemented by a diode-connected MOSFET MN1 operating in a weak-inversion region and having a temperature coefficient inversely proportional to temperature, in other words, a negative temperature coefficient. In this case, the diode-connected MOSFET MN1 has a resistance value that is inversely proportional to temperature to control the level of the intermediate current I2 according to a temperature change. In other words, since the resistance of the diode-connected MOSFET MN1 increases as temperature increases, the amount of the intermediate current I2 that is the current copied from the reference current I1 gradually decreases.

Thus, the current-voltage converter 165 may generate the intermediate current I2 having a complementary to absolute temperature (CTAT) characteristic that is inversely proportional to temperature, by tracking a temperature change, and control the voltage level of the sensing node ND2 according to the generated intermediate current I2. In addition, the current-voltage converter 165 may convert the intermediate current I2 to the sensing voltage Vx and supply the converted sensing voltage Vx as an input signal of a second comparator 171.

The second voltage-current conversion circuit 170 may include the second comparator 171 and a voltage-current converter 173. The second comparator 171 may receive the sensing voltage Vx input to a first input terminal (−) and a voltage of an output terminal ND3 of the current bias circuit 110 input to a second input terminal (+), and compare the two received voltages and generate a second comparison voltage according to a result of the comparison. In addition, the second comparison voltage may be output to the ring oscillator 120 as the first bias voltage VBP.

The voltage-current converter 173 may include a switch 175, a transistor MN2, and a transistor MN3. The switch 175 is connected between the first node and the output terminal ND3, and may form a current path between the first node and the output terminal ND3 in response to the second comparison voltage output from the second comparator 171. In addition, the switch 175 may further include a transistor MP6 operating in a linear region.

The transistor MN2 is connected between the output terminal ND3 and the second node. A gate of the transistor MN2 is connected to the sensing node ND2. The fourth transistor MN2 may be controlled in response to the sensing voltage Vx output from the current-voltage conversion circuit 160. In addition, the transistor MN3 is connected between the output terminal ND3 and the second node. A gate and a drain of the transistor MN3 are commonly connected to the output terminal ND3. The transistor MN3 may be controlled in response to the voltage of the output terminal ND3.

In a symmetric load including the transistor MN2 operating in a triode area and the diode-connected transistor MN3, the current flowing in the symmetric load has a characteristic that changes almost linearly like a resistor according to the sensing voltage Vx. The symmetric load has a resistance value proportional to temperature so that the level of the bias current I3 may be controlled according to a temperature change. When temperature increases, the amount of current flowing in the symmetric load increases so that a bias current having a proportional to absolute temperature (PTAT) characteristic that is proportional to temperature may flow in the current-voltage converter 173.

However, the current bias circuit 110 may control the amount of current flowing in the symmetric load by using the sensing voltage Vx having the CTAT characteristic that tracks a temperature change to generate the bias current I3 regardless of the temperature change because the PTAT characteristic of the bias current I3 is compensated by the CTAT characteristic of the sensing voltage Vx. Thus, the oscillator 100 generates input power of the current bias circuit 110 by using the sensing voltage Vx that tracks the temperature change so that the bias current I3 that is constant in view of the temperature change may be obtained. The voltage-current converter 173 may control the voltage level of the output terminal ND3 based on the amount of current flowing in the symmetric load. In addition, the voltage of the output terminal ND3 may output to the ring oscillator 120 as the second bias voltage VBN.

The voltage applied to the symmetric load is removed from the current-voltage converter 173. The symmetric load in FIG. 2 is similar to that of a symmetric load 133 of FIG. 5 included in the differential inverter 131. In addition, the second comparator 171 compares the sensing voltage Vx and the voltage of the output terminal ND3 and generates the first bias voltage VBP such that the voltage of the output terminal ND3 may be the same as the level of the sensing voltage Vx according to a result of the comparison. Thus, even when the power voltage $V_{DD}$ changes so that the control voltage VCTRL changes as well, since the voltage of the output terminal ND3 is made to be the same as the control voltage VCTRL, the bias current I3 may be constantly supplied regardless of a change in the power voltage $V_{DD}$ by adjusting the first bias voltage VBP to have the same swing range.

Figure 3:
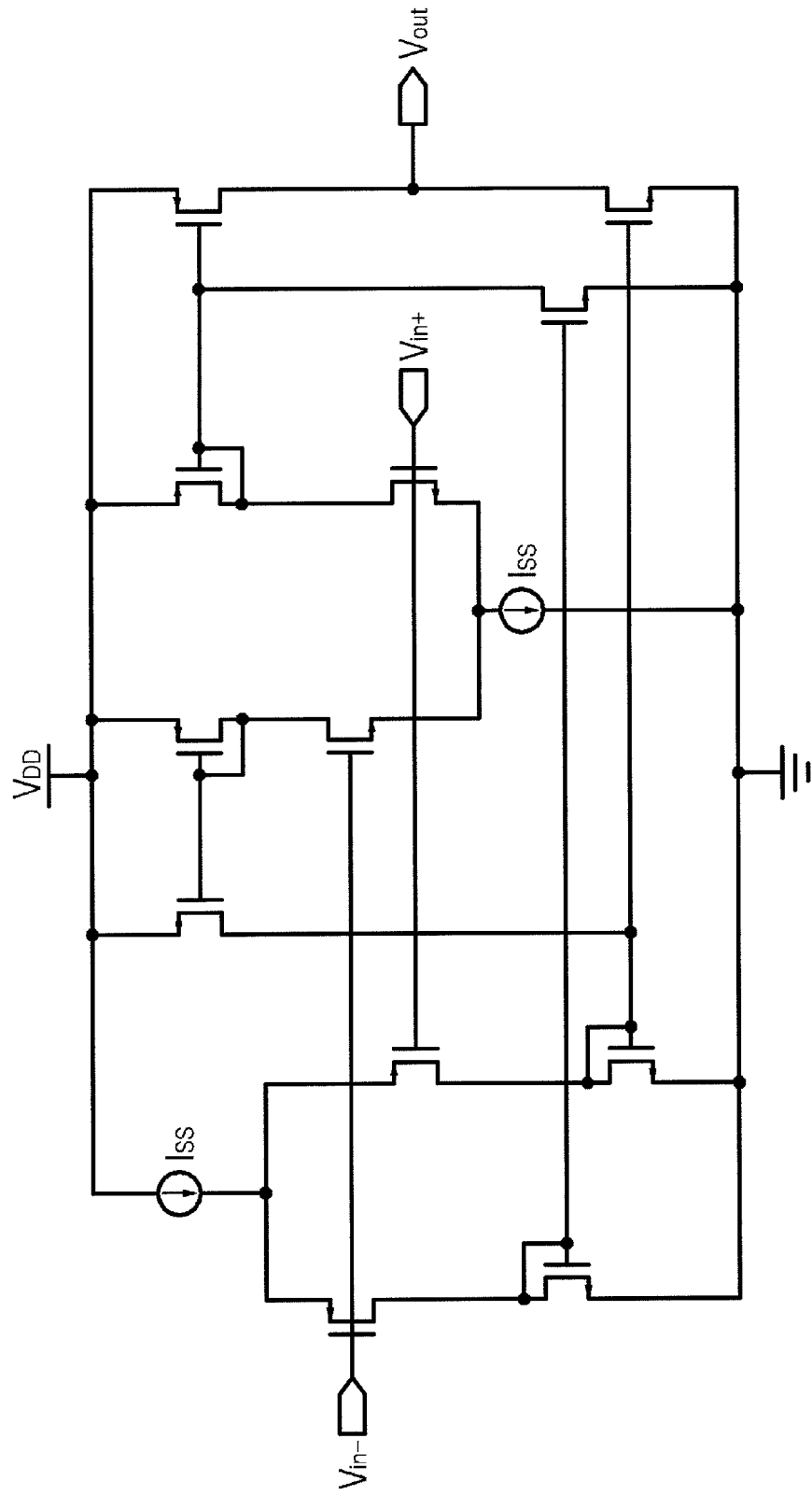
FIG. 3 is a circuit diagram of a first comparator of FIG. 2.

FIG. 3 is a circuit diagram of the first comparator 151 of FIG. 2. Referring to FIG. 3, the first comparator 151 may receive the first input signal Vin− and the second input signal Vin+, compare the received first input signal Vin− and second input signal Vin+, and output a comparison voltage Vout according to a result of the comparison.

For example, when first input signal Vin− is higher than the second input signal Vin+, the first comparator 151 may output a comparison signal having a first logic level, for example, a low level, and increase the level of the first comparison voltage. In addition, when first input signal Vin− is lower than the second input signal Vin+, the first comparator 151 may output a comparison signal having a second logic level, for example, a high level, and decrease the level of the first comparison voltage. The first input signal Vin− may be the control voltage VCTRL, the second input signal Vin+ may be the voltage of the feedback node ND1, and the output signal Vout may be the output signal of the first comparator 151.

Figure 4:
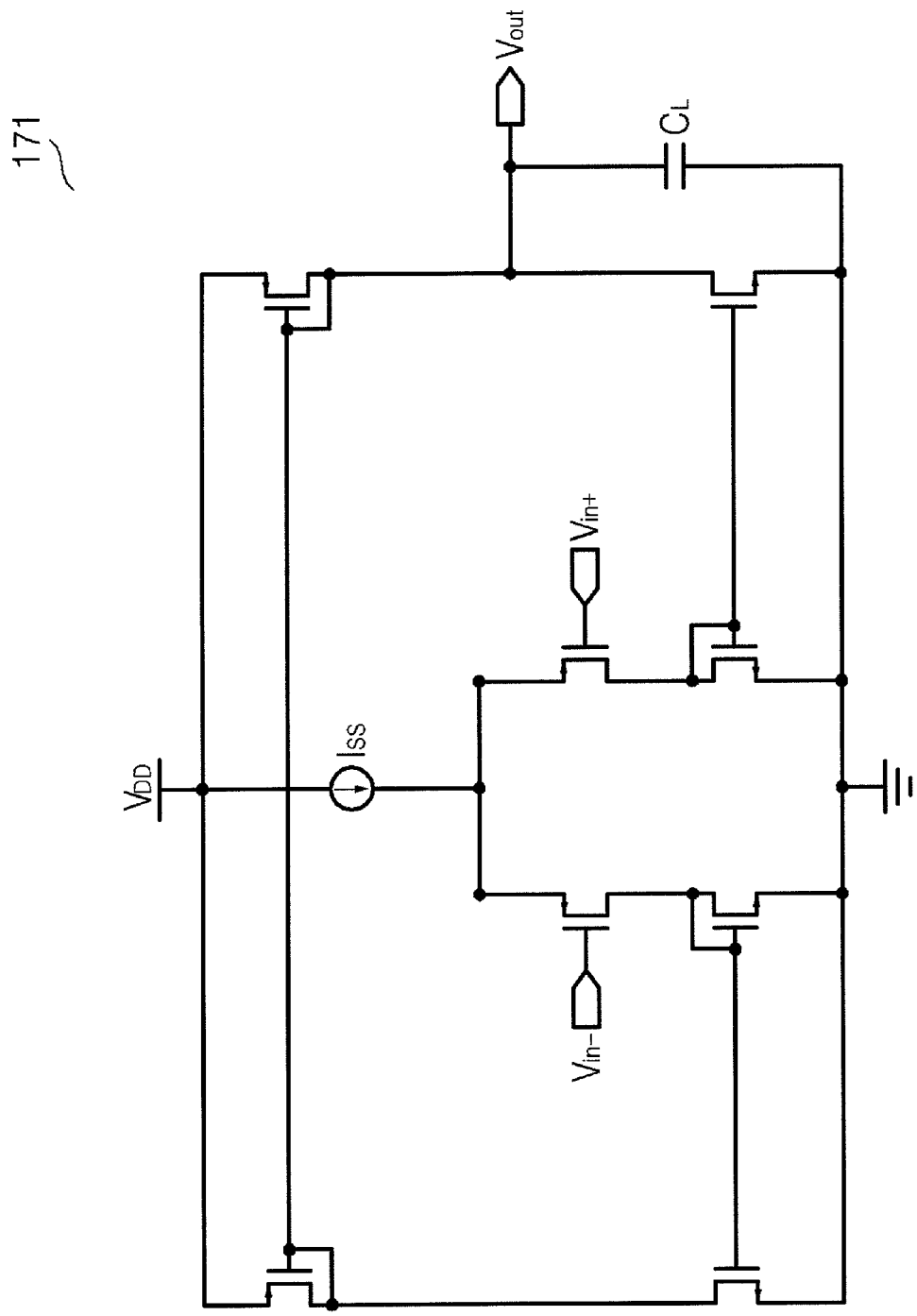
FIG. 4 is a circuit diagram of a second comparator of FIG. 2.

FIG. 4 is a circuit diagram of the second comparator 171 of FIG. 2. Referring to FIG. 4, the second comparator 171 may receive the first input signal Vin− and the second input signal Vin+, compare the received first input signal Vin− and second input signal Vin+, and output a comparison voltage Vout according to a result of the comparison. The comparison voltage Vout is controlled such that the level of the second input signal Vin+ may be gradually the same as the level of the first input signal Vin−.

The first input signal Vin− is the sensing voltage Vx output from the current-voltage conversion circuit 160. The second input signal Vin+ may be the voltage of the output terminal ND3 of the current bias circuit 110, in other words, the second bias voltage VBN. In addition, the output signal Vout may be the first bias voltage VBP.

Figure 5:
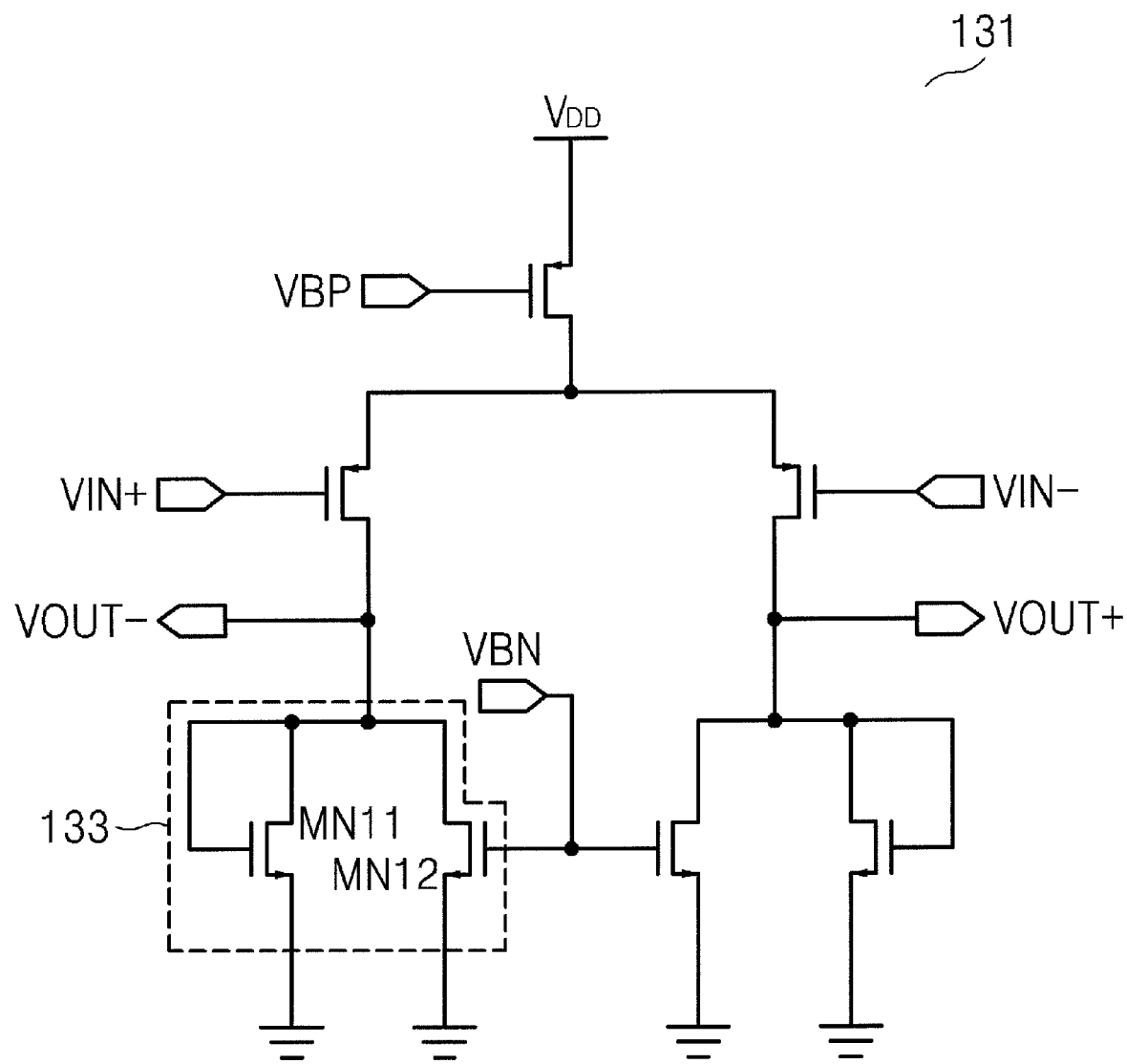
FIG. 5 is a circuit diagram of a differential inverter of FIG. 1.

FIG. 5 is a circuit diagram of one of the differential inverters 131 of FIG. 1. Referring to FIG. 5, the differential inverter 131 is an inverter of a common source type and includes a differential amplifier having the symmetric load 133.

The differential inverter 131 is biased to the bias current I3 in response to the first bias voltage VBP output from the current bias circuit 110 and may control the levels of the output signals Vout− and Vout+ through the output terminals in response to the voltage difference between the first input signal Vin− and the second input signal Vin+, in other words, VBN. The symmetric load 133 is connected between the each of the output terminals and the ground, and includes a first transistor MN11 used as a diode by connecting a gate and a drain and a second transistor MN12 operating in a triode region according to the second bias voltage VBN. The current flowing in the symmetric load 133 has a characteristic that almost linearly changes like a resistor according to the second bias voltage VBN.

Since the second bias voltage VBN gradually becomes the same as the control voltage VCTRL that is an input of the current bias circuit 110, the actual load resistance of the differential inverter 131 changes according to the control voltage VCTRL so that the swing range of the differential output signals VOUT− and VOUT+ of the differential inverter 131 may be changed and thus the delay time of the differential inverter 131 may be adjusted. In other words, the differential inverter 131 may generate the differential output signals VOUT− and VOUT+ having a constant frequency by changing the delay time by adjusting the resistance value of the symmetric load according to the first and second bias voltages VBP and VBN.

The bias current I3 of the current bias circuit 110 may change with the characteristic of being proportional to a temperature change, which means that the characteristic of the frequency has a characteristic of being proportional to the temperature. Thus, when the temperature of the oscillator 100 changes, the bias current I3 flowing in the differential inverter 131 varies so that the delay time of the differential inverter 131 may change.

For example, when the temperature increases, as the amount of the bias current of the differential inverter 131 decreases, the amount of current flowing in the symmetric load 133 decreases so that the delay time of the differential inverter 131 may be increased. In addition, when the temperature decreases, as the amount of the bias current of the differential inverter 131 increases, the amount of current flowing in the symmetric load 133 increases so that the delay time of the differential inverter 131 may be decreased. Accordingly, when the delay time of the differential inverter 131 varies according to the temperature change, the differential inverter 131 may not generate the differential output signals VOUT− and VOUT+ having a constant frequency.

However, the oscillator 100 according to the present exemplary embodiment may generate the differential output signals VOUT− and VOUT+ having a constant frequency regardless of the temperature change, by providing the bias current I3 that is constant in view of the temperature change, to the differential inverter 131.

In other words, the oscillator 100 may generate the bias voltages VBP and VBN to control the bias current I3 by automatically sensing changes in the power voltage and the temperature at the current bias circuit 110, and allow a constant bias current to flow through the ring oscillator 120 according to the generated bias voltages VBP and VBN. Thus, the oscillator 100 may stably generate the oscillation signal OSC_CLK having a constant frequency.

Figure 6:
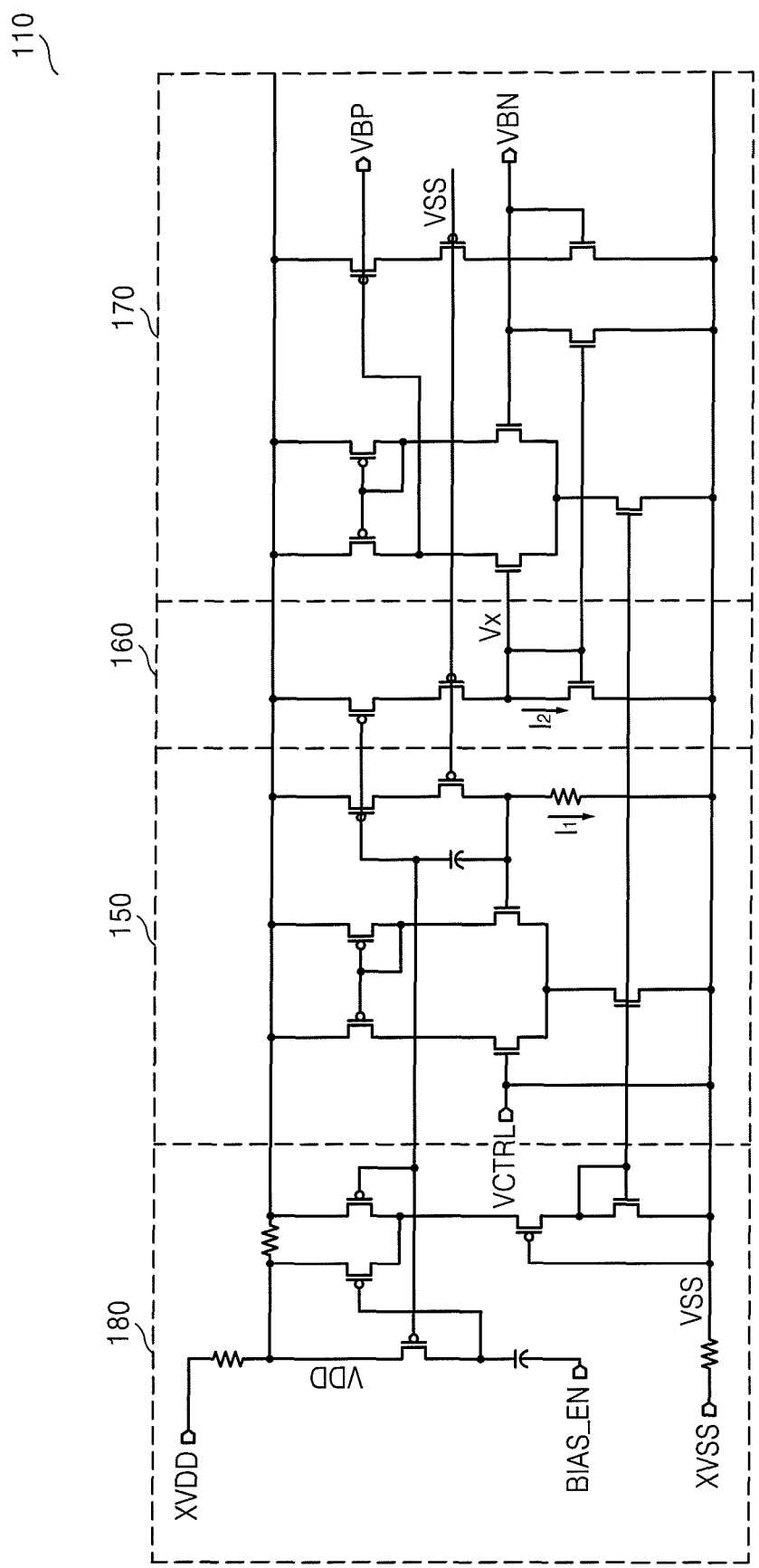
FIG. 6 is a circuit diagram of a current bias circuit according to an exemplary embodiment of the present inventive concept.

FIG. 6 is a circuit diagram of the current bias circuit 110 of FIG. 2. Referring to FIG. 6, the current bias circuit 110 may include a bias circuit 180, the first voltage-current conversion circuit 150, the current-voltage conversion circuit 160, and the second voltage-current conversion circuit 170. Since the first voltage-current conversion circuit 150, the current-voltage conversion circuit 160, and the second voltage-current conversion circuit 170, which are illustrated in FIG. 6, except for the bias circuit 180, are the same as those of FIG. 2, detailed descriptions thereof will be omitted.

The bias circuit 180 enables the operation of each of the first voltage-current conversion circuit 150 and the second voltage-current conversion circuit 170, in response to an enable signal BIAS_EN that is externally input, and may include a plurality of transistors. In other words, the bias circuit 180 may generate a constant current in response to the enable signal BIAS_EN, bias each of the first voltage-current conversion circuit 150 and the second voltage-current conversion circuit 170 by using the generated current, and control the operation of each of the first voltage-current conversion circuit 150 and the second voltage-current conversion circuit 170. Accordingly, each of the first voltage-current conversion circuit 150, the current-voltage conversion circuit 160, and the second voltage-current conversion circuit 170 are operated so that the bias current I3 that does not vary due to the changes in the power voltage and temperature may be generated.

Figure 7:
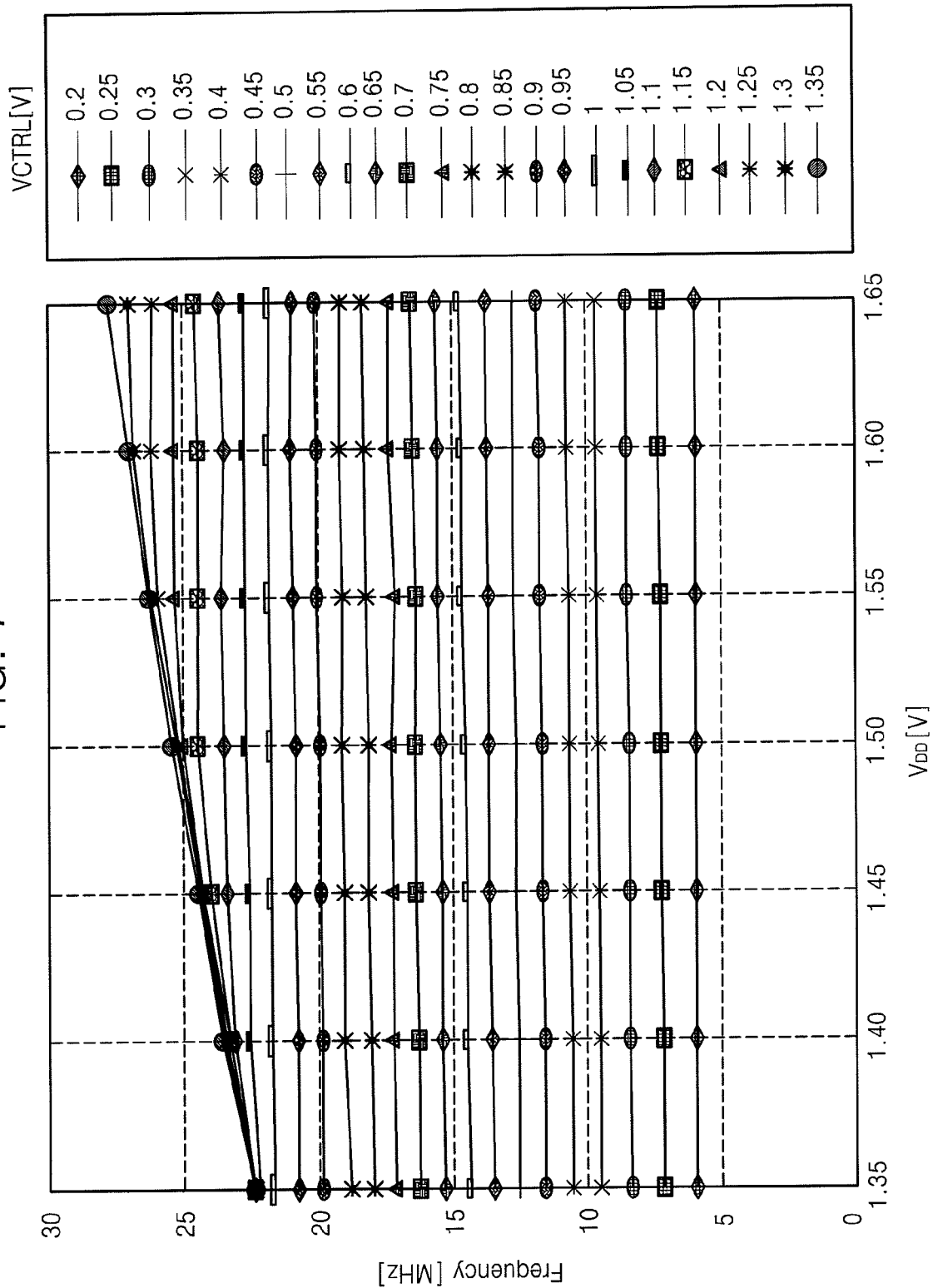
FIG. 7 is a graph showing the frequency characteristic of a signal output from an oscillator at certain power and control voltages according to an exemplary embodiment of the present inventive concept.

FIG. 7 is a graph showing the frequency characteristic of a signal output from the oscillator 100 at certain power and control voltages according to an exemplary embodiment of the present inventive concept. Referring to FIG. 7, the output signal of the oscillator 100 is hardly affected by the change in the power voltage $V_{DD}$ and has an almost constant frequency according to the control voltage VCTRL. Thus, the oscillator 100 may generate the oscillation signal OSC_CLK having a variety of frequencies in a large range as the control voltage VCTRL varies.

Figure 8:
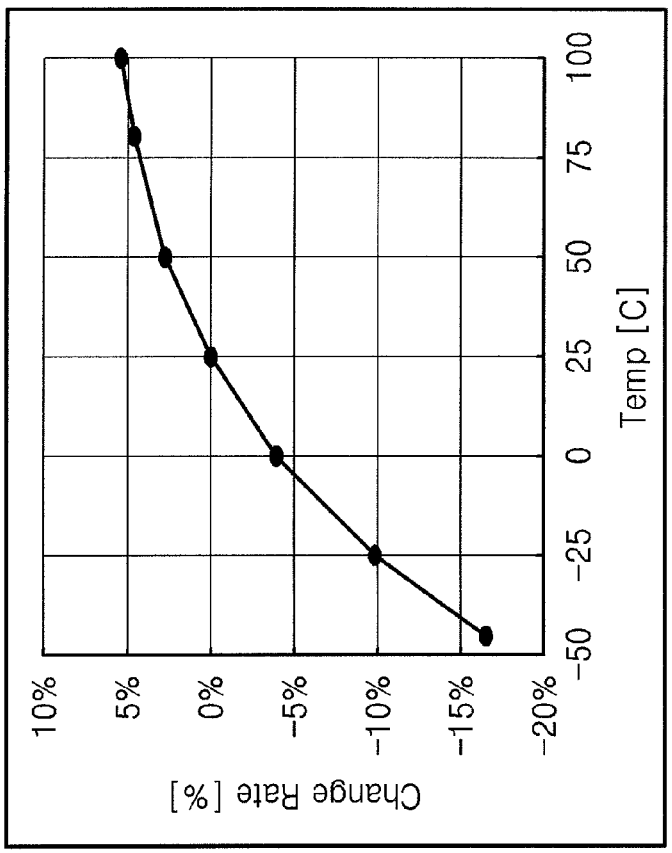
FIG. 8 includes graphs showing the frequency change and the change rate of a signal output from a conventional oscillator according to a temperature change in the conventional oscillator.
Figure 8:
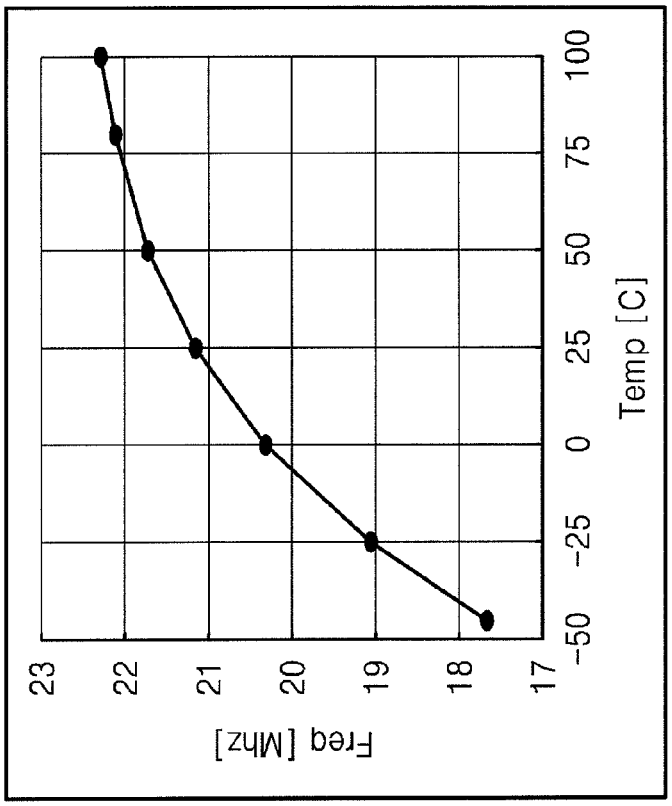

FIG. 8 includes graphs showing the frequency change and the change rate of a signal output from a conventional oscillator according to a temperature change in the conventional oscillator. Referring to FIG. 8, in the conventional oscillator, as temperature increases, frequency rapidly increases so that the speed of the output signal of the oscillator is greatly increased according to the temperature change. Although the conventional oscillator is not affected by the power voltage, it can be seen that there is a deviation of about 15% according to the temperature change.

Figure 9:
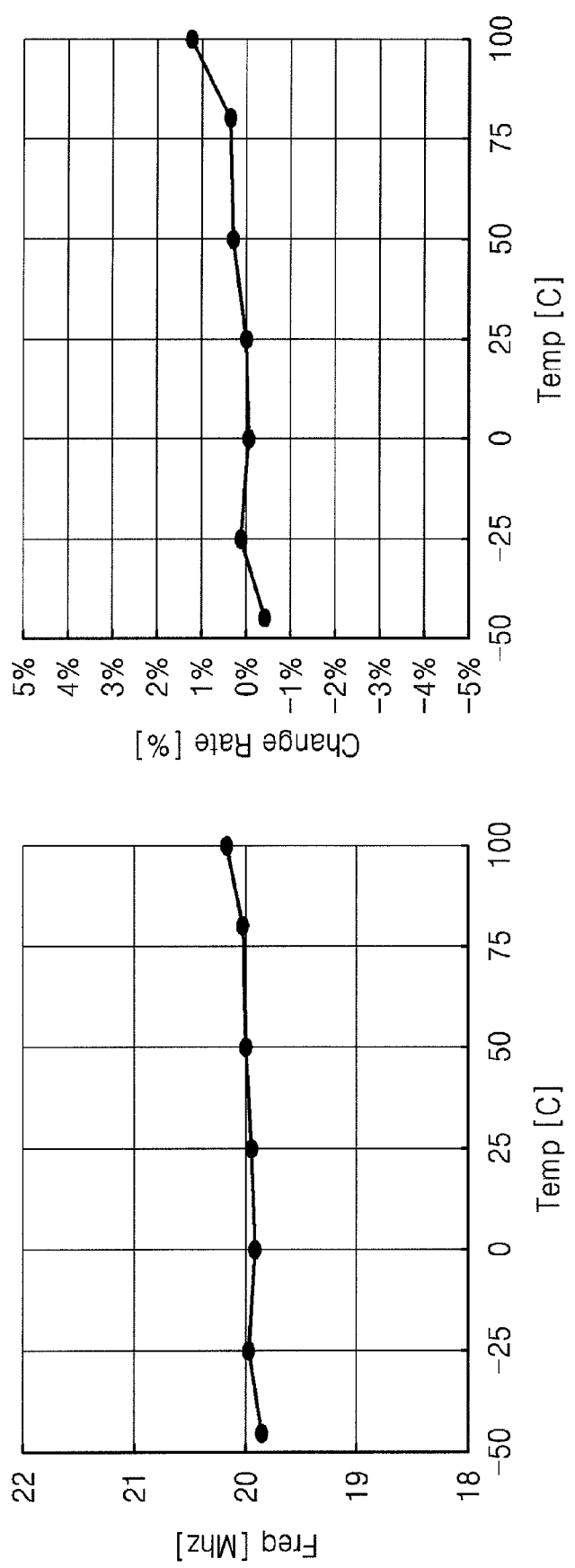
FIG. 9 includes graphs showing the frequency change and the change rate of a signal output from an oscillator according to a temperature change in the oscillator according to an exemplary embodiment of the present inventive concept.

FIG. 9 includes graphs showing the frequency change and the change rate of a signal output from an oscillator according to a temperature change in the oscillator according to an exemplary embodiment of the present inventive concept. Referring to FIG. 9, since the ring oscillator 120 has a constant frequency when there is a temperature change, the output signal of the oscillator 100 has an almost constant value regardless of the temperature change. Accordingly, it can be seen that the oscillator 100 is not affected by the power voltage and has a deviation within about 1% according to the temperature change.

Thus, as the oscillator 100 provides the bias current I3 that is constant in view of the changes in the power voltage and the temperature, it can be seen that the change rate of the oscillator 100 according to the temperature change is considerably reduced compared to the change rate of the conventional oscillator.

Figure 10:
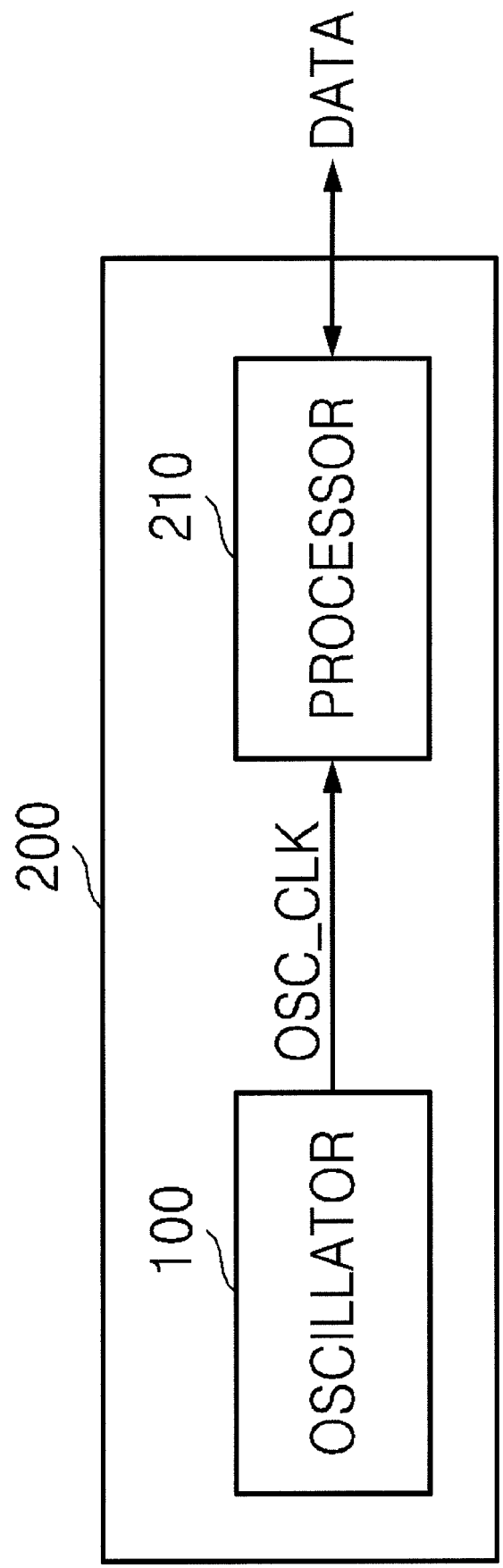
FIG. 10 is a block diagram of a signal processing device including an oscillator according to an exemplary embodiment of the present inventive concept.

FIG. 10 is a block diagram of a signal processing device 200 including an oscillator according to an exemplary embodiment of the present inventive concept. Referring to FIG. 10, the signal processing device 200 includes the oscillator 100 and a processor 210. The signal processing device 200 may be a display device, a synchronous memory, or a clock based processor.

The oscillator 100 may output a drive signal (in other words, an oscillation signal) OSC_CLK to drive the processor 210. The processor 210 may generally control a write operation, a read operation, or a verification read operation of the signal processing device 200 in response to the drive signal OSC_CLK. For example, the processor 210 outputs a command to control the write operation of the signal processing device 200 and write data DATA in response to the drive signal OSC_CLK output from the oscillator 100. In addition, the processor 210 may generate a command to control the read operation or the verification read operation of the signal processing device 200 in response to the drive signal OSC_CLK.

When the signal processing device 200 is implemented as a display device, the signal processing device 200 may include the oscillator 100, a timing controller (not shown), and a source driver (not shown). In this case, the timing controller may divide the drive signal OSC_CLK output from the oscillator 100 and generate an internal clock signal or a control signal suitable for an internal circuit. The source driver may control a data input/output operation in response to the internal clock signal.

As described above, the current bias circuit 110 may supply the bias current I3 that is constant in view of the temperature change to the oscillator 100 by using the sensing voltage Vx that tracks the temperature change. In other words, by generating an input power of the current bias circuit 110 using the sensing voltage Vx having the CTAT characteristic by tracking the temperature change, the CTAT characteristic of the sensing voltage Vx that tracks the temperature change and the PTAT characteristic of the actual bias current generated in the current bias circuit 110 are offset by each other so that the bias current I3 that is constant in view of the power voltage and the temperature change may be generated.

Thus, the oscillator 100 according to an exemplary embodiment of the present inventive concept generates the oscillation signal OSC_CLK that is constant and unaffected by the temperature change, by generating the bias voltages VBP and VBN by tracking the temperature change and controlling the bias current I3 of the internal circuit according to the bias voltages VBP and VBN.

Figure 11:
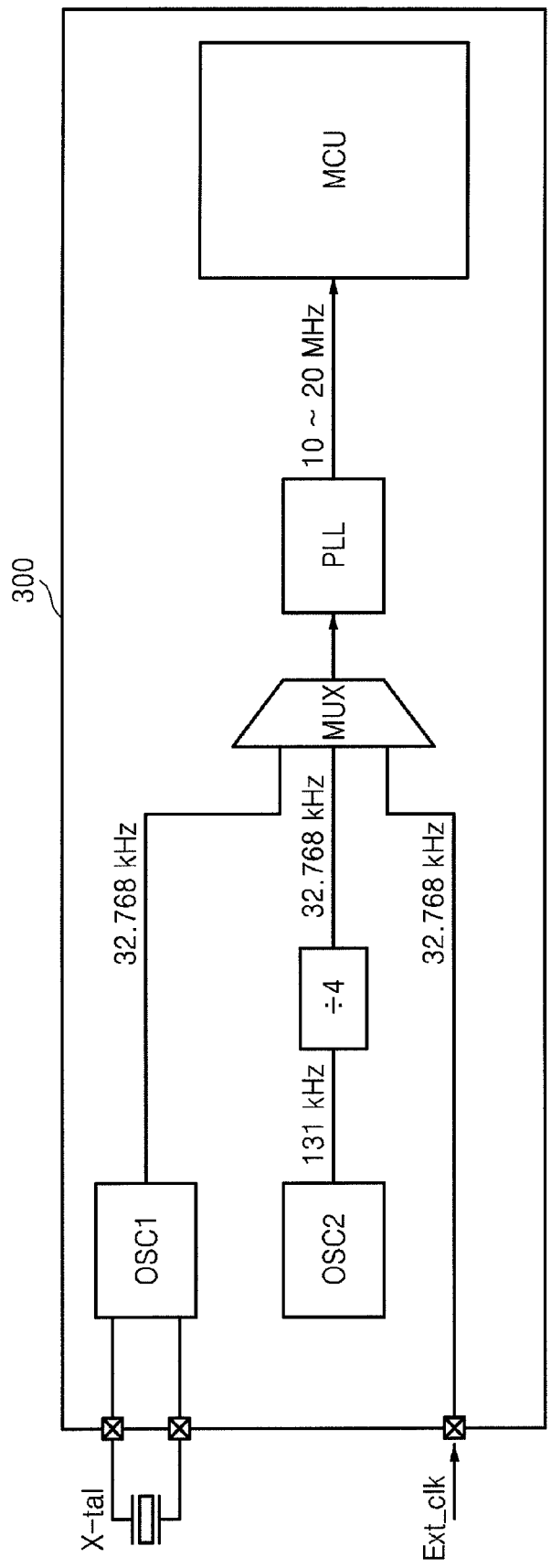
FIG. 11 is a block diagram of a signal processing device including a conventional oscillator.
Figure 12:
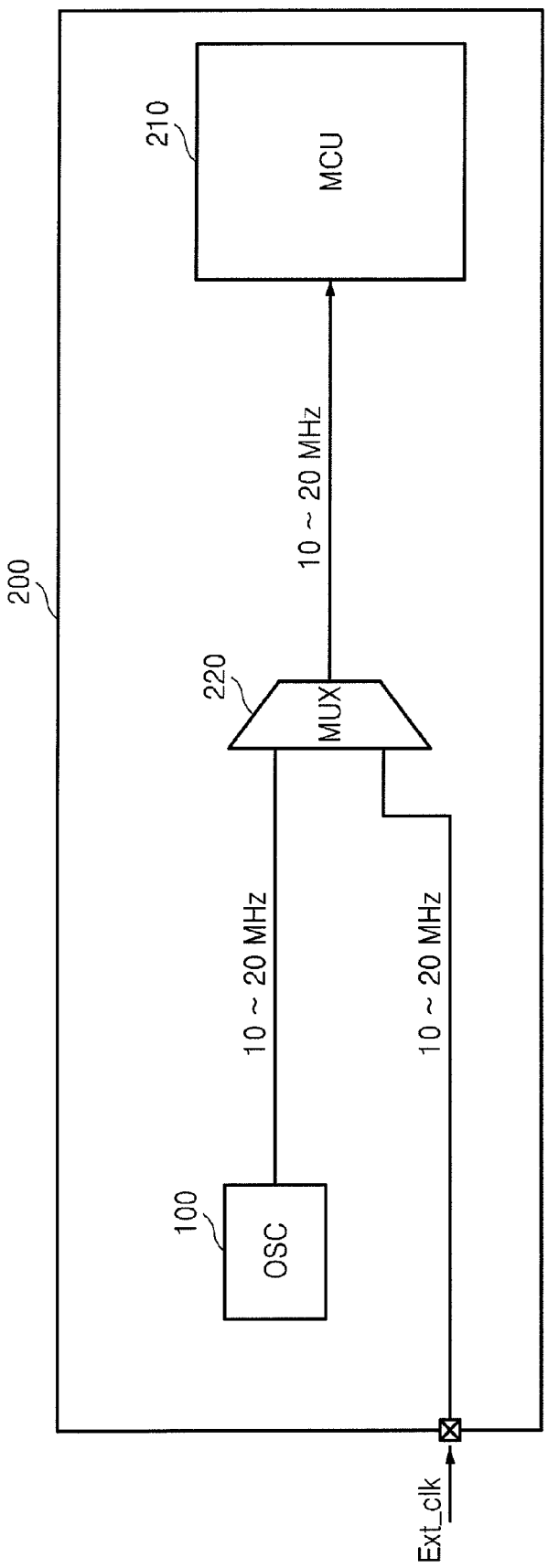
FIG. 12 is a block diagram of a signal processing device including an oscillator according to an exemplary embodiment of the present inventive concept.

FIG. 11 is a block diagram of a signal processing device 300 including a conventional oscillator. FIG. 12 is a block diagram of a signal processing device 200 including an oscillator according to an exemplary embodiment of the present inventive concept. For example, the signal processing device 200 of FIG. 12 includes the oscillator 100, a multiplexer 220 and a microcontroller unit 210.

Referring to FIG. 11, the conventional signal processing device 300 generally uses an external crystal oscillator X-tal. The external oscillator, which is used to generate a frequency under a 1 MHz range, is a relaxation oscillator. To use the relaxation oscillator at high speed, an internal RC value is designed to be small. Such design may cause not only an increase in power consumption according to an increase in frequency, but a sensitive reaction to changes in power voltage and temperature.

However, the signal processing device 200 in FIG. 12 may generate an oscillation signal that is constant and unaffected by changes in power voltage and temperature, by using the oscillator 100. In addition, the oscillator 100 that is implemented by a differential ring oscillator may operate at high speed and have characteristics of using low power and low area.

The oscillator according to an exemplary embodiment of the present inventive concept may be used not only for a display driver IC of a display but for a variety of applications requiring a frequency within a 100 MHz range. The oscillator according to an exemplary embodiment of the present inventive concept may generate an oscillation signal that is constant and unaffected by a temperature change, by generating the bias voltages by tracking the temperature change of the oscillator and controlling the bias current of an internal circuit according to the bias voltages.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. An oscillator, comprising:
    a current bias circuit tracking a temperature change of the oscillator by using a control voltage and generating a plurality of bias voltages to supply a substantially constant bias current in light of the temperature change; and
    a ring oscillator comparing differential output signals generated according to the bias voltages and generating an oscillation signal as a result of the comparison,
    wherein the current bias circuit comprises:
        a first voltage-current conversion circuit converting the control voltage to a reference current;
        a current-voltage conversion circuit sensing the temperature change of the oscillator and converting the reference current to a sensing voltage according to a result of the sensing; and
        a second voltage-current conversion circuit converting the sensing voltage to the bias current,
    wherein the first voltage-current conversion circuit comprises:
        a first comparator comparing the control voltage and a voltage of a feedback node and generating a first comparison voltage;
        a transistor supplying a power voltage to the feedback node in response to the first comparison voltage; and
        a reference current generation circuit generating the reference current based on a voltage of the feedback node.

2. The oscillator of claim 1, further comprising a bias circuit enabling operation of the first and second voltage-current conversion circuits in response to an enable signal.

3. The oscillator of claim 1, wherein the reference current is determined based on the control voltage and a resistance value of the reference current generation circuit.

4. The oscillator of claim 1, wherein the current-voltage conversion circuit copies the reference current and converts the copied reference current to the sensing voltage.

5. The oscillator of claim 1, wherein the current-voltage conversion circuit comprises:
    a voltage-current converter generating an intermediate current controlled according to the first comparison voltage; and
    a current-voltage converter converting the intermediate current to the sensing voltage.

6. The oscillator of claim 5, wherein the current-voltage converter comprises a diode-connected MOSFET that has a temperature coefficient reversely proportional to temperature.

7. The oscillator of claim 1, wherein the second voltage-current conversion circuit comprises:
    a second comparator comparing the sensing voltage and a voltage of an output terminal of the current bias circuit and outputting a second comparison voltage; and
    a voltage-current converter supplying the bias current controlled according to the second comparison voltage to the output terminal of the current bias circuit.

8. The oscillator of claim 7, wherein the voltage-current converter comprises a symmetric load that causes the bias current having a proportional to absolute temperature characteristic to be offset by the sensing voltage having a complementary to absolute temperature characteristic.

9. The oscillator of claim 8, wherein the symmetric load comprises a transistor controlled in response to the sensing voltage and a diode-connected transistor controlled in response the second comparison voltage.

10. The oscillator of claim 1, further comprising a band gap reference circuit generating the control voltage.

11. An oscillator, comprising:
    a current bias circuit tracking a change in a power voltage applied to the oscillator by using a control voltage and generating a plurality of bias voltages to supply a substantially constant bias current despite the power voltage change; and
    a ring oscillator including an oscillator unit and a comparator, wherein the ring oscillator is driven by the bias current to produce an oscillation signal, wherein the current bias circuit comprises:
a first voltage-current conversion circuit converting the control voltage to a reference current;
a current-voltage conversion circuit sensing the power voltage change of the oscillator and converting the reference current to a sensing voltage according to a result of the sensing; and
a second voltage-current conversion circuit converting the sensing voltage to the bias current,
wherein the first voltage-current conversion circuit comprises:
a first comparator comparing the control voltage and a voltage of a feedback node and generating a first comparison voltage;
a transistor supplying the power voltage to the feedback node in response to the first comparison voltage; and
a reference current generation circuit generating the reference current based on a voltage of the feedback node.

12. A signal processing device, comprising:
an oscillator providing a drive signal, wherein the oscillator comprises:
a current bias circuit tracking a temperature change of the oscillator by using a control voltage and generating a plurality of bias voltages to supply a substantially constant bias current in light of the temperature change; and
a ring oscillator comparing differential output signals generated according to the bias voltages and generating the drive signal as a result of the comparison,
wherein the current bias circuit comprises:
a first voltage-current conversion circuit converting the control voltage to a reference current;
a current-voltage conversion circuit sensing the temperature change of the oscillator and converting the reference current to a sensing voltage according to a result of the sensing; and
a second voltage-current conversion circuit converting the sensing voltage to the bias current,
wherein the first voltage-current conversion circuit comprises:
a first comparator comparing the control voltage and a voltage of a feedback node and generating a first comparison voltage;
a transistor supplying a power voltage to the feedback node in response to the first comparison voltage; and
a reference current generation circuit generating the reference current based on a voltage of the feedback node.

13. The signal processing device of claim 12, further comprising a processor controlling a data input/output operation in response to the drive signal.

14. The signal processing device of claim 12, further comprising:
a timing controller dividing the drive signal and generating a control signal; and
a source driver controlling a data input/output operation in response to the control signal.

* * * * *